United States Patent
Lee et al.

(10) Patent No.: US 10,784,130 B2
(45) Date of Patent: Sep. 22, 2020

(54) BONDING APPARATUS

(71) Applicant: SAMSUNG ELECTRONICS CO., LTD., Suwon-si, Gyeonggi-do (KR)

(72) Inventors: Joong-Ha Lee, Suwon-si (KR); Sang-Yoon Kim, Hwaseong-si (KR); YoungBum Kim, Yongin-si (KR); Hui-Jae Kim, Seoul (KR); SeungDae Seok, Yongin-si (KR); Jaebong Shin, Gunpo-si (KR); Byungjoon Lee, Yongin-si (KR); Yongin Lee, Seoul (KR); Jaeyeon Pyo, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 273 days.

(21) Appl. No.: 15/838,713

(22) Filed: Dec. 12, 2017

(65) Prior Publication Data

US 2018/0174871 A1 Jun. 21, 2018

(30) Foreign Application Priority Data

Dec. 20, 2016 (KR) ........................ 10-2016-0174828

(51) Int. Cl.
*H01L 21/67* (2006.01)
*H01L 21/68* (2006.01)
*H01L 27/148* (2006.01)
*H01L 21/683* (2006.01)

(52) U.S. Cl.
CPC .. *H01L 21/67144* (2013.01); *H01L 21/67092* (2013.01); *H01L 21/67259* (2013.01); *H01L 21/681* (2013.01); *H01L 21/6838* (2013.01); *H01L 27/148* (2013.01)

(58) Field of Classification Search
None
See application file for complete search history.

(56) References Cited

U.S. PATENT DOCUMENTS

| | | | | |
|---|---|---|---|---|
| 5,806,174 A | * | 9/1998 | Itoh | .................... H05K 13/0411 29/740 |
| 5,979,739 A | * | 11/1999 | Jin | .................... H01L 21/67144 228/6.2 |
| 6,252,412 B1 | | 6/2001 | Talbot et al. | |
| 7,353,596 B2 | * | 4/2008 | Shida | ................ H01L 21/67144 29/844 |
| 7,896,051 B2 | | 3/2011 | Kang et al. | |
| 9,209,051 B2 | | 12/2015 | Yoshiaki et al. | |
| 2010/0000081 A1 | * | 1/2010 | Noda | ...................... H01L 24/75 29/739 |

(Continued)

FOREIGN PATENT DOCUMENTS

| | | |
|---|---|---|
| JP | 5347452 B2 | 11/2013 |
| JP | 6013172 B2 | 10/2016 |
| WO | WO 2014/157134 A1 | 10/2014 |

*Primary Examiner* — Devang R Patel
(74) *Attorney, Agent, or Firm* — Lee IP Law, P.C.

(57) ABSTRACT

A bonding apparatus includes a stage supporting a substrate, a first bonding head at a first side of the stage, the first bonding head to pick up a first chip and to bond the picked-up first chip onto the substrate, a second bonding head at a second side of the stage, the second bonding head to pick up a second chip and to bond the picked-up second chip onto the substrate, and a first image acquisition unit over a movement path of the stage to acquire an image of the stage.

15 Claims, 13 Drawing Sheets

(56) References Cited

U.S. PATENT DOCUMENTS

| | | | |
|---|---|---|---|
| 2010/0122455 A1* | 5/2010 | Noda | H01L 21/67144 |
| | | | 29/832 |
| 2010/0243153 A1* | 9/2010 | Onitsuka | H01L 24/75 |
| | | | 156/290 |
| 2010/0263209 A1* | 10/2010 | Shimoyoshi | H01L 21/67144 |
| | | | 29/832 |
| 2011/0079361 A1 | 4/2011 | Park et al. | |
| 2013/0068824 A1 | 3/2013 | Mochizuki et al. | |
| 2013/0160952 A1* | 6/2013 | Hwang | H01L 21/67144 |
| | | | 156/556 |
| 2015/0155210 A1* | 6/2015 | Lee | H01L 24/75 |
| | | | 438/15 |

\* cited by examiner

BONDING APPARATUS

CROSS-REFERENCE TO RELATED APPLICATION

Korean Patent Application No. 10-2016-0174828, filed on Dec. 20, 2016, in the Korean Intellectual Property Office, and entitled: "Bonding Apparatus," is incorporated by reference herein in its entirety.

BACKGROUND

1. Field

Embodiments relate to a bonding apparatus and, more particularly, to a bonding apparatus for bonding a chip to a substrate.

2. Description of the Related Art

High-performance, high-speed and small electronic components have been increasingly demanded with the development of the electronic industry. To satisfy these demands, a plurality of semiconductor chips may be stacked on a single substrate and/or a package may be stacked on another package. These semiconductor mounting techniques may require a process of bonding solders and pads which correspond to electrical connection terminals between the substrate and the semiconductor chip and between the stacked semiconductor chips.

SUMMARY

In an aspect, a bonding apparatus may include a stage supporting a substrate, a first bonding head part located at a side of the stage and picking up a chip and bonding the picked-up chip onto the substrate, a second bonding head part located at another side of the stage and picking up a chip and bonding the picked-up chip onto the substrate, and a first image acquisition unit located over a movement path of the stage to acquire an image of the stage.

In another aspect, a bonding apparatus may include a base, a stage supporting a substrate and being movable on the base, a bonding unit located at a movement path of the stage on the base, and a first image acquisition unit located over the movement path and including a plurality of imaging devices arranged in a direction intersecting the movement path. The bonding unit may include a guide frame located over the movement path and intersecting the movement path, at least one support frame supporting the guide frame, and first and second bonding head parts facing each other on the guide frame and moving along the guide frame.

In another aspect, a bonding apparatus may include a stage supporting a substrate, the stage being moveable along a first direction, a first bonding head at a first side of the stage, the first bonding head to pick up a first chip and to bond the picked-up first chip onto the substrate, a second bonding head at a second side of the stage, the second bonding head to pick up a second chip and to bond the picked-up second chip onto the substrate, and the first and second bonding heads being moveable simultaneously along a second direction perpendicular to the first direction, and a first image acquisition unit over a movement path of the stage to acquire an image of the stage.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Embodiments will be described hereinafter in detail with reference to the accompanying drawings.

Figure 1:
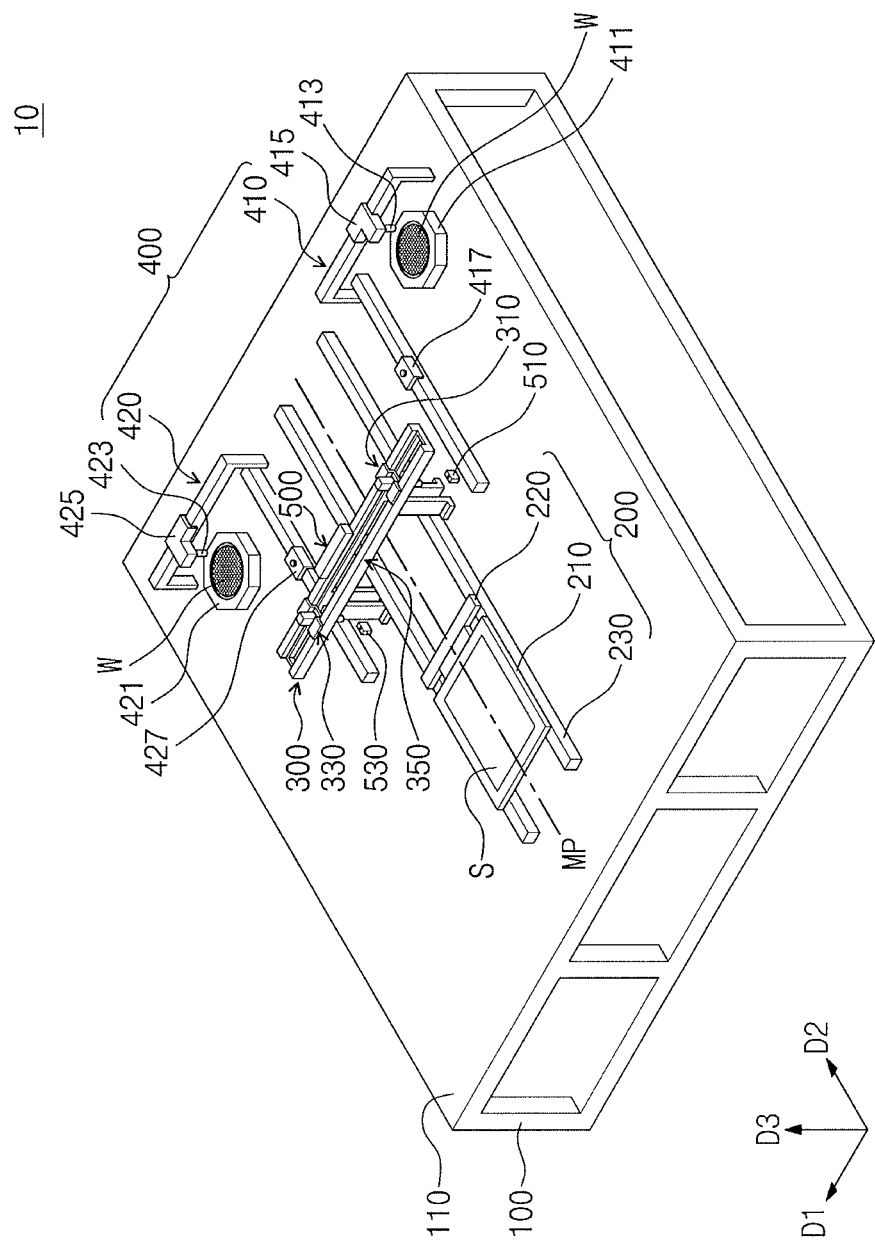
FIG. 1 illustrates a perspective view of a bonding apparatus according to some embodiments.
Figure 2:
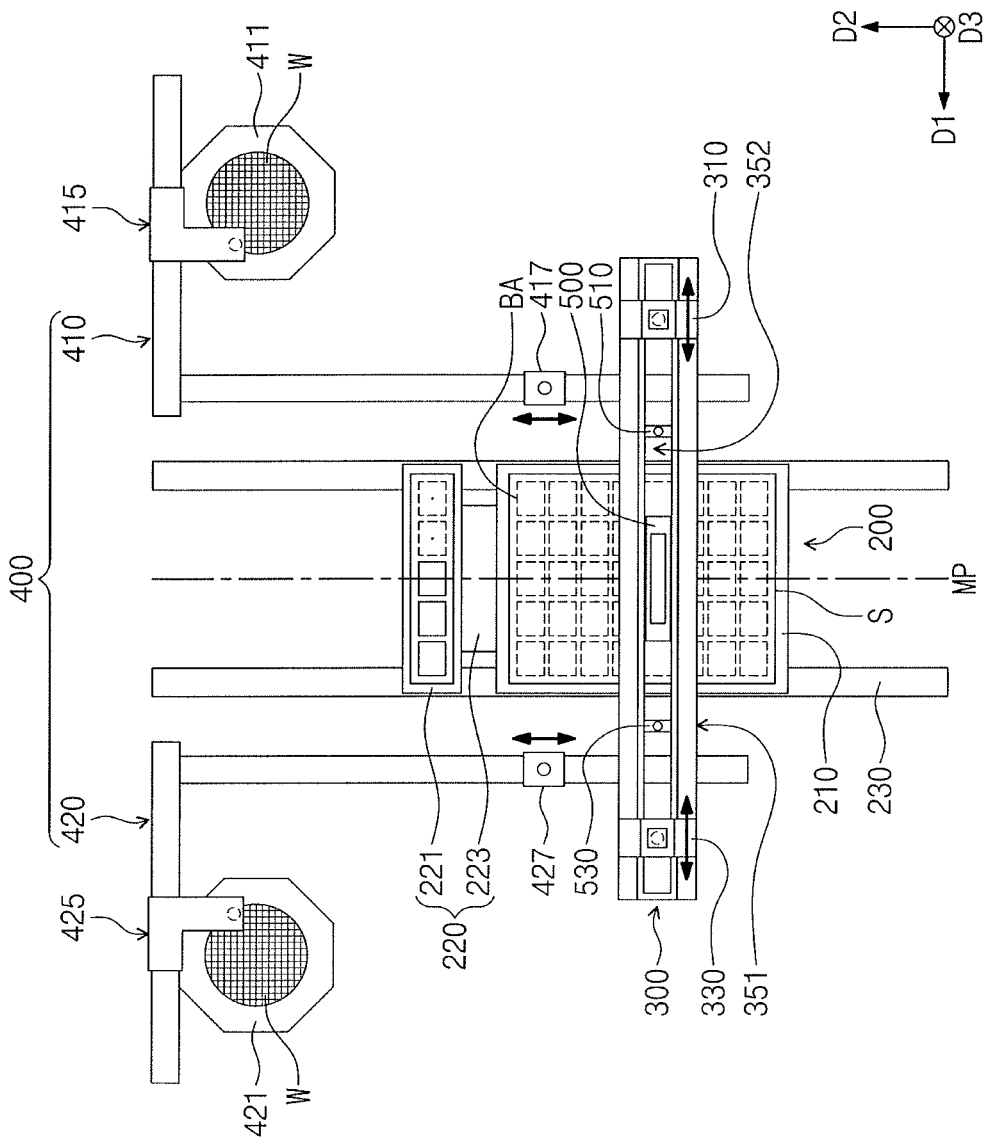
FIG. 2 illustrates a plan view of the bonding apparatus of FIG. 1.
Figure 3:
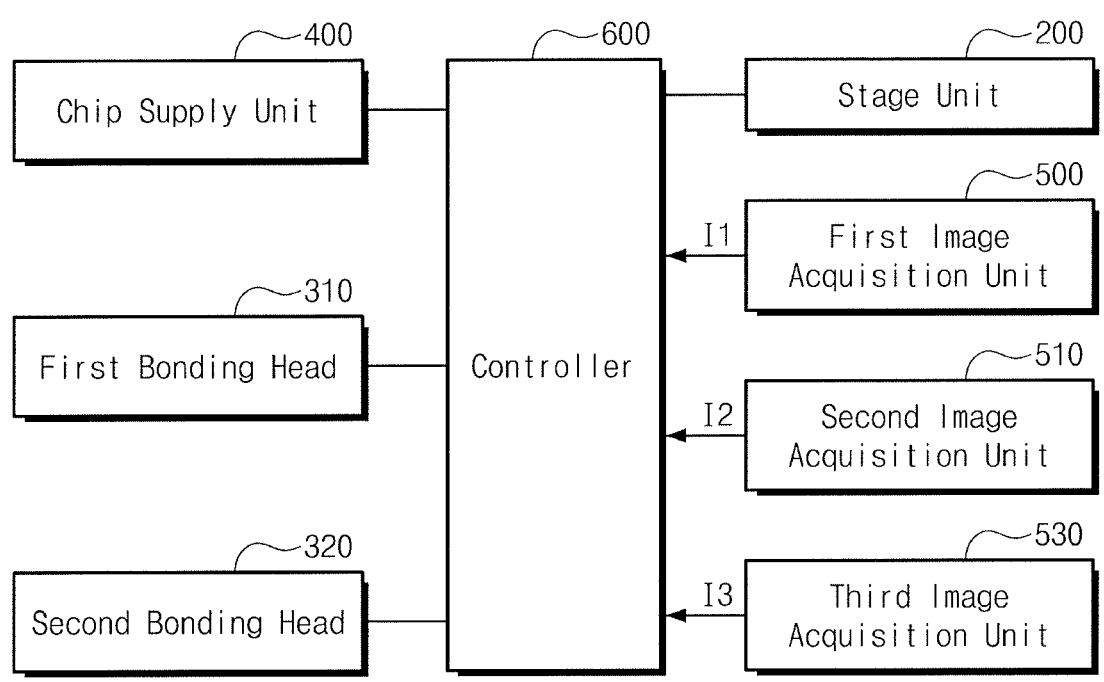
FIG. 3 illustrates a schematic block diagram of some components of the bonding apparatus of FIG. 1.

FIG. 1 is a perspective view illustrating a bonding apparatus according to some embodiments. FIG. 2 is a plan view illustrating the bonding apparatus of FIG. 1. FIG. 3 is a schematic block diagram illustrating components of the bonding apparatus of FIG. 1.

Referring to FIGS. 1 to 3, a bonding apparatus 10 according to some embodiments may bond a semiconductor chip to a substrate or may bond a semiconductor chip to another semiconductor chip bonded to a substrate. The bonding apparatus 10 may include a base 100, a stage unit 200 (i.e., a stage 200), a bonding unit 300, a chip supply unit 400 (i.e., a chip supply 400), a first image acquisition unit 500, a second image acquisition unit 510, a third image acquisition unit 530, and a controller 600 (FIG. 3).

The base 100 may support the stage 200, the bonding unit 300, the chip supply 400, and the first to third image acquisition units 500, 510, and 530. In other words, the stage 200, the bonding unit 300, the chip supply 400, and the first to third image acquisition units 500, 510, and 530 may be located, e.g., positioned, on the base 100.

The stage 200 may support a substrate S. The stage 200 may move along a movement path MP in a state in which it supports the substrate S. For example, the stage 200 may linearly reciprocate or move on the base 100 in parallel to a second direction D2. The stage 200 may include a stage transfer part 230, a bonding stage 210, and a revision chip-mounting part 220.

The stage transfer part 230 may move the bonding stage 210 and the revision chip-mounting part 220. The stage transfer part 230 may include a first transfer rail and a first driver (not shown). The first transfer rail part may include a pair of transfer rails extending in the second direction D2. The pair of transfer rails may be spaced apart from each other in a first direction D1 perpendicular to the second direction D2. The bonding stage 210 and the revision chip-mounting part 220 may be located on the pair of transfer rails. The first driver may move the bonding stage 210 and the revision chip-mounting part 220 along the first transfer rail part. The stage transfer part 230 may be, but is not limited to, a linear motor.

The substrate S may be loaded on the bonding stage 210. The bonding stage 210 may be formed to correspond to the substrate S, e.g., the bonding stage 210 may have a substantially same shape and size as the substrate S to accommodate and support the substrate S thereon. The substrate S may be, but is not limited to, a printed circuit board (PCB), a wafer, or a panel. The substrate S may include a plurality of bonding areas BA arranged along the first and second directions D1 and D2. For example, as illustrated in FIG. 2, the bonding areas BA may be arranged in a matrix form.

The revision chip-mounting part 220 may be coupled to the bonding stage 210. For example, the revision chip-mounting part 220 may be coupled to a side of the bonding stage 210 in the second direction D2. The revision chip-mounting part 220 will be described later in more detail with reference to FIG. 5.

The bonding unit 300 may be located at the movement path MP of the stage 200, e.g., the bonding unit 300 may be positioned above the movement path MP of the stage 200 to overlap a portion of the movement path MP. The movement path MP of the stage 200 may be parallel to, but not limited to, the second direction D2. The bonding unit 300 may bond a chip onto the substrate S disposed on the stage 200. The bonding unit 300 may include a gantry 350, a first bonding head 310, and a second bonding head 330.

Figure 4:
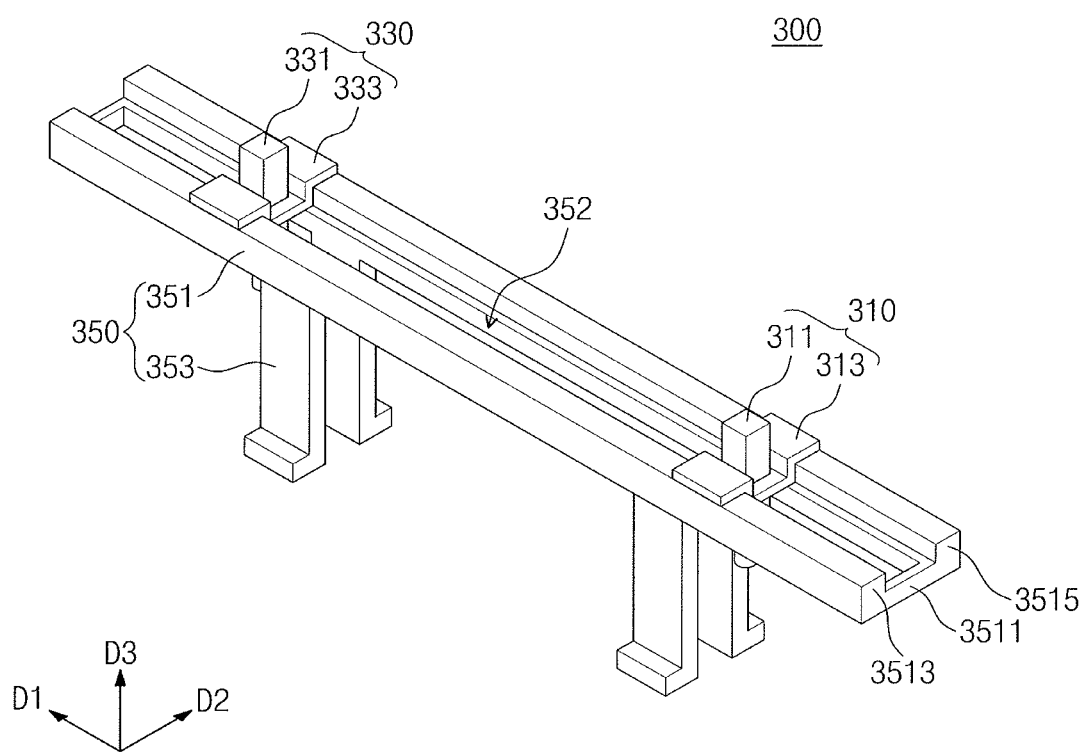
FIG. 4 illustrates a perspective view of a bonding unit of FIG. 1.

The gantry 350 may support the first and second bonding heads 310 and 330. The gantry 350 may be formed of a highly rigid material. For example, the gantry 350 may be formed of a ceramic material. The gantry 350 may have a cooling flow path therein. As illustrated in FIG. 4, the gantry 350 may include a guide frame 351 intersecting the movement path MP and a support frame 353.

The guide frame 351 may be upwardly spaced apart from the base 100. The guide frame 351 may be located at a higher level (or height) than the stage 200. Thus, when the guide frame 351 vertically overlaps with the stage 200, a space may be formed between the guide frame 351 and the stage 200. In some embodiments, the guide frame 351 may be parallel to the first direction D1. The guide frame 351 may perpendicularly intersect the movement path MP. However, embodiments are not limited thereto. The guide frame 351 may include an opening 352 passing, e.g., penetrating, therethrough. The opening 352 may be formed along the first direction D1, e.g., the opening 352 may have a slit shape extending along a longitudinal direction of the guide frame 351.

The support frame 353 may support the guide frame 351. The support frame 353 may be provided in plurality, and the support frames 353 may extend from the guide frame 351 toward the base 100. In some embodiments, a pair of support frames 353 may connect the guide frame 351 and the base 100. The pair of support frames 353 may be spaced apart from each other in the first direction D1. The stage 200 and/or the movement path MP of the stage 200 may be located between the pair of support frames 353.

The first and second bonding heads 310 and 330 may be movably installed on the gantry 350. For example, the first and second bonding heads 310 and 330 may be installed on the guide frame 351. The first and second bonding heads 310 and 330 may be upwardly spaced apart from the base 100. The first and second bonding heads 310 and 330 may be located at a higher level than the stage 200.

The first bonding head 310 may be disposed at a first side of the stage 200 or the movement path MP in a plan view, and the second bonding head 330 may be disposed at a second side of the stage 200 or the movement path MP in a plan view, e.g., the first and second bonding heads 310 and 320 may be spaced apart from each other along the first direction D1. The first and second bonding heads 310 and 330 may face each other on the guide frame 351. For example, as illustrated in FIG. 1, the first bonding head 310 may be disposed at the right side of the stage 200 or the movement path MP in plan view, and the second bonding head 330 may be disposed at the left side of the stage 200 or the movement path MP in plan view.

The first and second bonding heads 310 and 330 may move along the guide frame 351, i.e., in the first direction D1. Each of the first and second bonding heads 310 and 330 may include at least one bonding head. In some embodiments, each of the first and second bonding heads 310 and 330 may include a single bonding head. Hereinafter, the bonding head included in the first bonding head 310 is defined as a first bonding head and the bonding head included in the second bonding head 330 is defined as a second bonding head. In addition, the first and second bonding heads are indicated by the same reference numerals as the first and second bonding heads 310 and 330. In certain embodiments, each of the first and second bonding heads 310 and 330 may include a plurality of bonding heads.

The first and second bonding heads 310 and 330 may move along the opening 352 in a state in which portions of the first and second bonding heads 310 and 330 are inserted in the opening 352. When the first and second bonding heads 310 and 330 move along the guide frame 351, the first and second bonding heads 310 and 330 may move in the same direction. For example, when the first bonding head 310 moves in the first direction D1, the second bonding head 330 may also move in the first direction D1.

The first and second bonding heads 310 and 330 may pick up chips supplied from the chip supply 400. The first and second bonding heads 310 and 330 may bond the picked-up chips onto the substrate S. Here, "bonding the chip onto the substrate S" refers to bonding the chip to one surface of the substrate S and/or bonding the chip to one surface of another chip bonded to one surface of the substrate S. The first and second bonding heads 310 and 330 will be described later in more detail with reference to FIGS. 4 and 5.

The chip supply 400 may supply a chip to the bonding unit 300. The chip supply 400 may include a first chip supply 410 and a second chip supply 420. The first chip supply 410 may supply a first chip to the first bonding head 310. The second chip supply 420 may supply a second chip to the second bonding head 330. The first and second chips may be the same as or different from each other. The first chip supply 410 may be disposed at the first side of the stage 200 or the movement path MP, and the second chip supply 420 may be disposed at the second side of the stage 200 or the movement path MP. For example, the first and second chip supplies 410 and 420 may be located symmetrically with respect to the stage 200 or the movement path MP.

The first chip supply 410 may include a first wafer stage 411, a first chip picker 413, a first picker transfer part 415, and a first chip transfer part 417. The second chip supply 420 may include a second wafer stage 421, a second chip picker 423, a second picker transfer part 425, and a second chip transfer part 427. In some embodiments, the first and second chip supplies 410 and 410 may have the same components. For the purpose of ease and convenience in explanation, the first chip supply part 410 will be mainly described hereinafter.

The first wafer stage 411 may support a wafer W including the first chip, e.g., the wafer W may include a plurality of the first chips. For example, the plurality of first chips may be formed by cutting the wafer W by a sawing apparatus.

The first chip picker 413 may be located over the first wafer stage 411, e.g., the first chip picker 413 is the dashed circle above the wafer in FIG. 2. The first chip picker 413 may ascend and descend in parallel to a third direction D3. The first chip picker 413 may pick up the first chips of the wafer W one by one by using a vacuum pressure.

The first picker transfer part 415 may transfer the first chip picker 413 to the first chip transfer part 417, e.g., the first picker transfer part 415 may move along a frame from the first wafer stage 411 toward the first chip transfer part 417 while holding the first chip picker 413 with the first chip (FIG. 1). In some embodiments, the first picker transfer part 415 may move in parallel to the first direction D1. The first picker transfer part 415 may transfer the first chip picker 413 toward the first chip transfer part 417.

The first chip transfer part 417 may transfer the first chip provided from the first chip picker 413 to the first bonding head 310, e.g., the first chip transfer part 417 may move along a rail from the first picker transfer part 415 toward the first bonding head 310 with the first chip thereon. In some embodiments, the first chip transfer part 417 may move in parallel to the second direction D2. The first chip transfer part 417 may transfer or move the first chip toward the first bonding head 310. The first chip transferred by the first chip transfer part 417 may be located at a lower level than the first bonding head 310.

Alternatively, in certain embodiments, each of the first and second chip supplies 410 and 420 may include only the wafer stages 411 or 421 and the chip pickers 413 or 423, respectively. In other words, the chip transfer parts 417 and 427 and the picker transfer parts 415 and 425 may be omitted. The first and second chip supplies 410 and 420 may be located below the first and second bonding heads 310 and 330, respectively. The chip pickers 413 and 423 may pick up the chips of the wafers W on the wafer stage 411 or 421. The chip pickers 413 and 423 may rotate the chips by 180 degrees such that the chips may be inverted. In other words, the chip pickers 413 and 423 may flip the chips over. The first and second bonding heads 310 and 330 may pick up the rotated chips from the chip pickers 413 and 423.

The first image acquisition unit 500 may be located at a higher level than the stage 200. The first image acquisition unit 500 may acquire an image of the stage 200 over the stage 200. Thus, the first image acquisition unit 500 may obtain first image data I1. In some embodiments, the first image data I1 may include a top surface image of the substrate S on the bonding stage 210 and/or a top surface image of the revision chip-mounting part 220. The first image acquisition unit 500 may transmit the first image data I1 to the controller 600.

The first image acquisition unit 500 may be fixedly located over the gantry 350. The first image acquisition unit 500 may be located at a higher level than the first and second bonding heads 310 and 330. Thus, the first image acquisition unit 500 may not interrupt the movement of the first and second bonding heads 310 and 330.

The first image acquisition unit 500 may be located over the movement path MP of the stage 200. At least a portion of the first image acquisition unit 500 may vertically overlap with the opening 352. In some embodiments, the first image acquisition unit 500 may acquire an image of the substrate S disposed on the stage 200 through the opening 352 when the stage 200 (e.g., the bonding stage 210) vertically overlaps with the opening 352. The first image acquisition unit 500 will be described later in more detail with reference to FIG. 5.

The second image acquisition unit 510 may be located under the first bonding head 310 and/or the guide frame 351. For example, the second image acquisition unit 510 may be disposed under a movement path of the first bonding head 310. The second image acquisition unit 510 may acquire an image of a bottom portion of the first bonding head 310 under the first bonding head 310. In some embodiments, the second image acquisition unit 510 may acquire an image of the chip picked-up by the first bonding head 310 to obtain second image data I2. The second image acquisition unit 510 may transmit the second image data I2 to the controller 600.

The third image acquisition unit 530 may be located under the second bonding head 330 and/or the guide frame 351. For example, the third image acquisition unit 530 may be disposed under a movement path of the second bonding head 330. The third image acquisition unit 530 may acquire an image of a bottom portion of the second bonding head 330 under the second bonding head 330. In some embodiments, the third image acquisition unit 530 may acquire an image of the chip picked-up by the second bonding head 330 to obtain third image data I3. The third image acquisition unit 530 may transmit the third image data I3 to the controller 600.

Each of the second and third image acquisition units 510 and 530 may be an up-looking camera that can take an image of a bottom surface of each of the first and second bonding heads 310 and 330 on the base 100 in an upward direction. The second and third image acquisition units 510 and 530 may be fixedly located on the base 100.

The controller 600 may control the stage 200 and the bonding unit 300. For example, the controller 600 may control the movement of the first and second bonding heads 310 and 330 and/or the movement of the stage 200. The controller 600 may also control the chip supply 400.

The controller 600 may receive the first to third image data I1, I2, and I3. The controller 600 may detect a foreign material on the substrate S by using the first image data I1, e.g., based on the obtained first image data I1. Thus, it is possible to prevent the substrate S from being broken or damaged by the foreign material in a bonding process. As described above, the first image acquisition unit 500 may acquire an image of an entire top surface of the substrate S at once. The first image data I1 may include the image of the entire top surface of the substrate S. As a result, the bonding apparatus 10 may quickly perform inspection of the foreign material.

The controller 600 may control the first and second bonding heads 310 and 330 by using the first to third image data I1, I2, and I3. The controller 600 will be described later in more detail.

Figure 5:
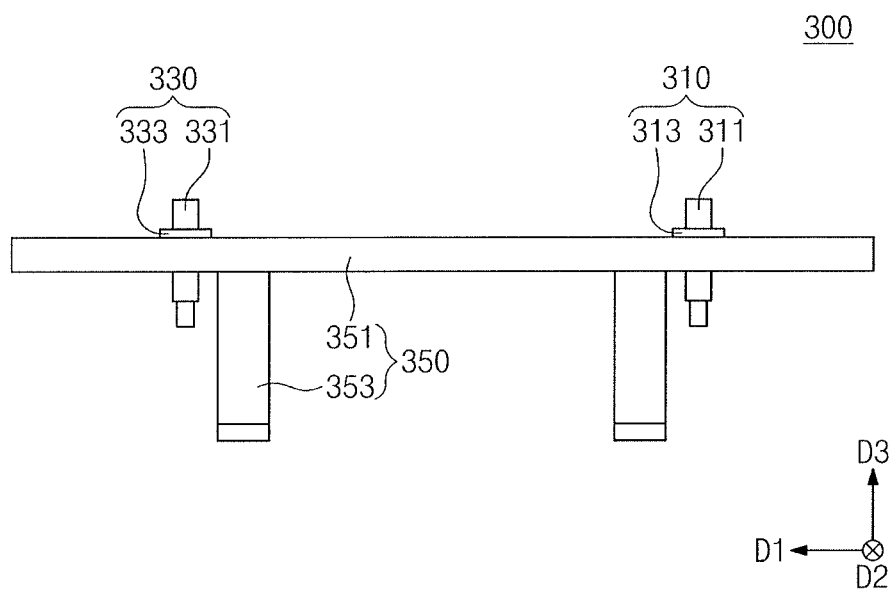
FIG. 5 illustrates a front view of the bonding unit of FIG. 1.

FIG. 4 is a perspective view illustrating the bonding unit 300. FIG. 5 is a front view illustrating the bonding unit 300.

Referring to FIGS. 1, 2, 4, and 5, the bonding unit 300 may include the gantry 350 and the first and second bonding heads 310 and 330. As described above, the gantry 350 may include the guide frame 351 and the support frame 353.

The guide frame 351 may be formed to extend in the first direction D1. The guide frame 351 may include a body portion 3511, a first rail 3513, and a second rail 3515. The body portion 3511 may have a rectangular shape extending in the first direction D1. The opening 352 may be provided in an intermediate portion of the body portion 3511.

The first and second rails 3513 and 3515 may extend from the body portion 3511. The first and second rails 3513 and 3515 may be spaced apart from each other in the second direction D2. For example, the first and second rails 3513 and 3515 may be disposed on opposite ends of the body portion 3511 in the second direction D2, respectively. First and second bonding picker transfer parts 313 and 333 to be described later may be disposed on the first and second rails 3513 and 3515.

The first bonding head 310 may include a first bonding picker 311 and a first bonding picker transfer part 313. The second bonding head 330 may include a second bonding picker 331 and a second bonding picker transfer part 333. The first and second bonding heads 310 and 330 may have the same components, and thus the first bonding head 310 will be mainly described hereinafter for the purpose of ease and convenience in explanation.

The first bonding picker 311 may pick up the chip by using a vacuum pressure, e.g., the first bonding picker 311 may extend through the first bonding picker transfer part 313 and through the opening 352 of the body portion 3511 toward base 100 (FIG. 5). The first bonding picker 311 may move in a direction approaching the base 100 and a direction away from the base 100. In other words, the first bonding picker 311 may ascend and descend in parallel to the third direction D3 perpendicular to the first and second directions D1 and D2.

The first bonding picker transfer part 313 may connect the first bonding picker 311 to the guide frame 351. The first bonding picker transfer part 313 may transfer the first bonding picker 311 along the guide frame 351. In other words, the first bonding picker 311 may reciprocate, e.g., move, in parallel to the first direction D1 by the first bonding picker transfer part 313.

Figure 6:
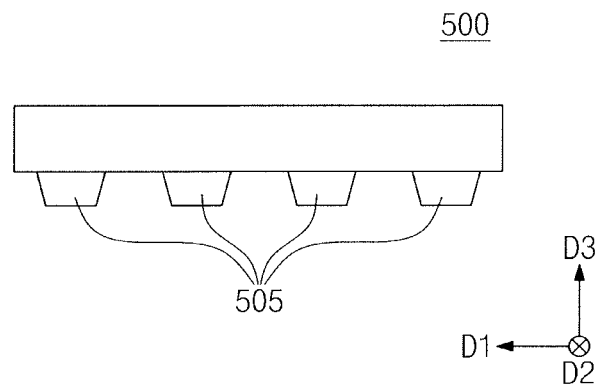
FIG. 6 illustrates a schematic view of a first image acquisition unit of FIG. 1.

FIG. 6 is a schematic view illustrating the first image acquisition unit 500.

Referring to FIGS. 1, 2, and 6, the first image acquisition unit 500 may include a plurality of imaging devices 505 arranged in the first direction D1, e.g., to be spaced apart from each other in the first direction D1. In some embodiments, the first direction D1 may be parallel to a width direction of the stage 200 and/or a width direction of the substrate S. Alternatively, in certain embodiments, the first direction D1 may be parallel to a longitudinal direction of the stage 200 and/or a longitudinal direction of the substrate S. The imaging devices 505 may be arranged in a different direction from the first direction D1 as well as the first direction D1. For example, the imaging devices 505 may be arranged in the first direction D1 and the second direction D2 perpendicular to the first direction D1. In other words, the imaging devices 505 may be arranged in a matrix form. For example, the imaging devices 505 may be arranged on a support substrate to face the substrate S on the stage 200, e.g., the imaging devices 505 may be between the support substrate and the substrate S.

Each of the imaging devices 505 may be, but not limited to, a charge-coupled device (CCD) image sensor. In some embodiments, the first image acquisition unit 500 may be an array camera. The first image acquisition unit 500 may acquire the image of the entire top surface of the substrate S in one shot.

Figure 7A:
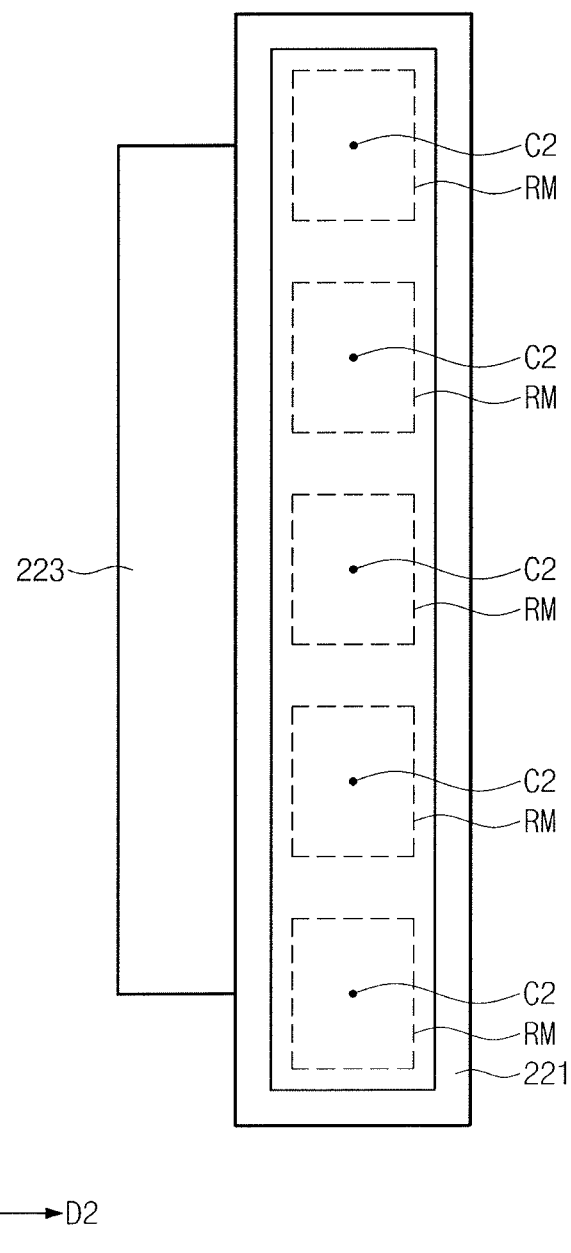
FIG. 7A illustrates a plan view of a revision chip-mounting part of FIG. 2.
Figure 7B:
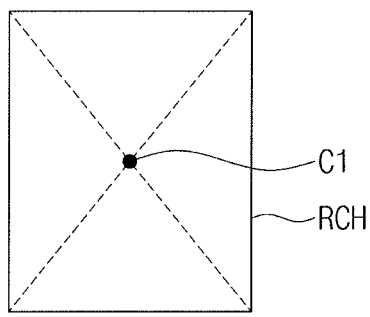
FIG. 7B illustrates a plan view of a revision chip mounted on the revision chip-mounting part of FIG. 7A.

FIG. 7A is a plan view illustrating the revision chip-mounting part 220. FIG. 7B is a plan view illustrating a revision chip mounted on the revision chip-mounting part 220.

Referring to FIGS. 2 and 7A, the revision chip-mounting part 220 may include a reference marker part 221 and a coupling part 223. The coupling part 223 may be located between the reference marker part 221 and the bonding stage 210 to couple the revision chip-mounting part 220 to the bonding stage 210.

The reference marker part 221 may include a plurality of mounting areas RM. The mounting areas RM may be arranged in the first direction D1. The mounting areas RM may be spaced apart from each other. The number of the mounting areas RM may be equal to the number of the bonding areas BA of the substrate S, which are arranged in the first direction D1. For example, when five bonding areas BA are arranged in the first direction D1 on the substrate S, the reference marker part 221 may include five mounting areas RM. The mounting areas RM may correspond to the bonding areas of the substrate S. For example, sizes of the bonding areas BA may be equal to sizes of the mounting areas RM. Each of the mounting areas RM may include a second reference point C2. The second reference point C2 may be located at a center of the mounting area RM. However, embodiments are not limited thereto.

Referring to FIGS. 7A and 7B, revision chips RCH may be mounted on the mounting areas RM, respectively. The revision chip RCH may be supplied from the chip supply 400. The revision chip RCH may be formed of a glass or a transparent resin material. A first reference point C1 may be formed on the revision chip RCH. The first reference point C1 may be located at a center of a top surface or a bottom surface of the revision chip RCH or in the revision chip RCH.

Each of the first and second reference points C1 and C2 may have a circular point shape. However, embodiments are not limited thereto. In certain embodiments, each of the first and second reference points C1 and C2 may have a cross shape or a polygonal shape.

FIGS. 8A to 8E are schematic views illustrating stages in a process of bonding chips to the substrate S by the first and second bonding heads 310 and 330.

Referring to FIGS. 1, 2, 3, and 8A, the stage 200 supporting the substrate S may move along the movement path MP. The stage 200 may be positioned to vertically overlap with the opening 352 of the guide frame 351 and the first image acquisition unit 500. The first image acquisition unit 500 may acquire an image of the substrate S disposed on the stage 200 through the opening 352. Thus, the first image acquisition unit 500 may obtain the first image data I1 and may transmit the first image data I1 to the controller 600.

The controller 600 may analyze the first image data I1 to determine whether a foreign material exists on the substrate S or not. At this time, the first bonding head 310 may be located over the first chip transfer part 417. In other words, the first bonding head 310 may be positioned to vertically overlap with the first chip transfer part 417. When the controller 600 determines that foreign material does not exist on the substrate S, the controller 600 may control the first and second bonding heads 310 and 330 in such a way that the first and second bonding heads 310 and 330 bond the chips onto the substrate S.

Referring to FIGS. 1, 2, 3, and 8B, the first bonding head 310 may ascend and descend in parallel to the third direction D3 to pick up the first chip CH1 from the first chip transfer part 417. In detail, the first bonding head 310 may descend downward to grip the first chip CH1 on the first chip transfer part 417. The first bonding head 310 may ascend upward to lift the gripped first chip CH1 from the first chip transfer part 417.

Figure 8A:
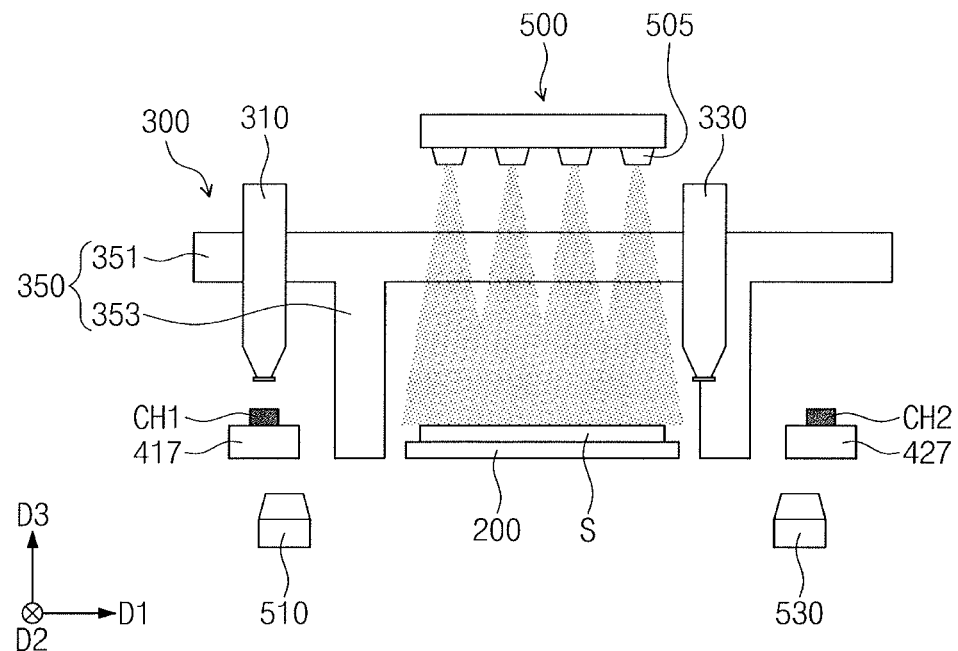
FIGS. 8A to 8E illustrate schematic views of stages in a process of bonding chips to a substrate by first and second bonding heads of FIG. 1.
Figure 8B:
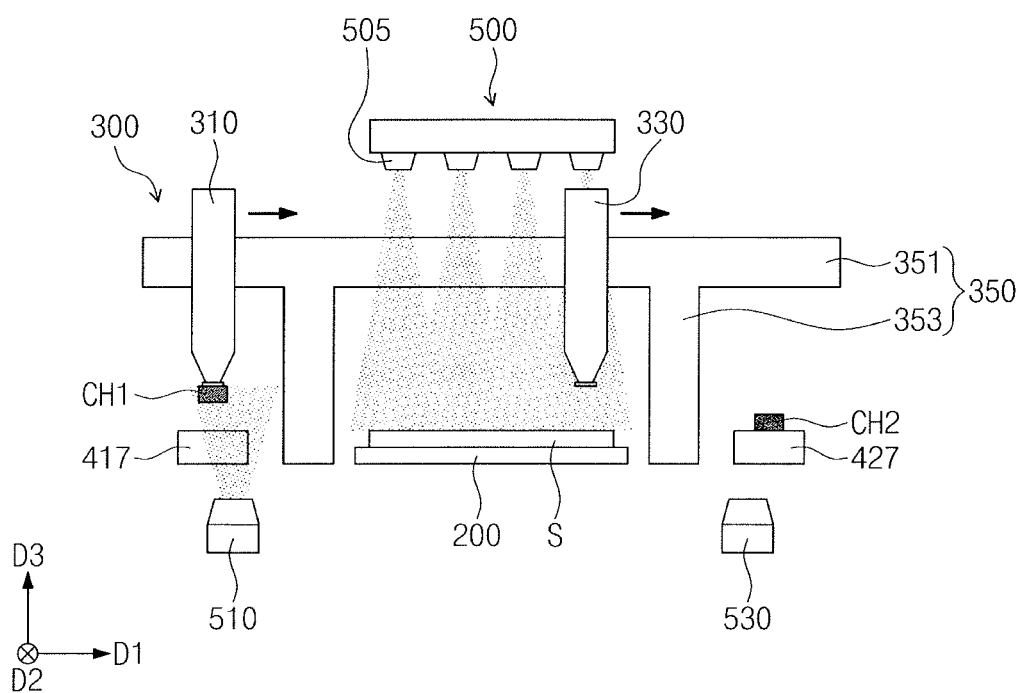
Figure 8C:
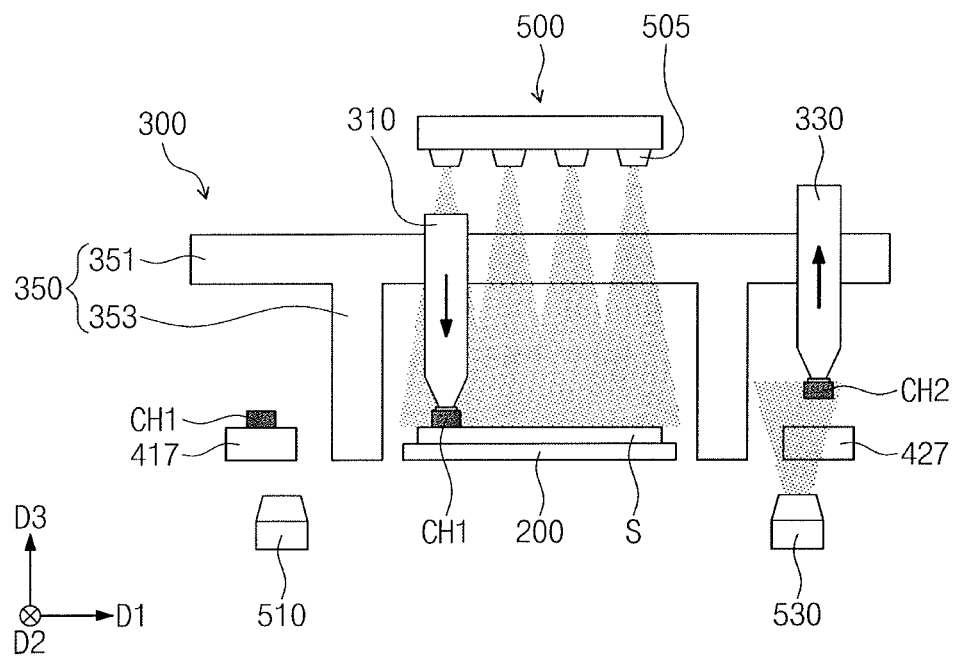
Figure 8D:
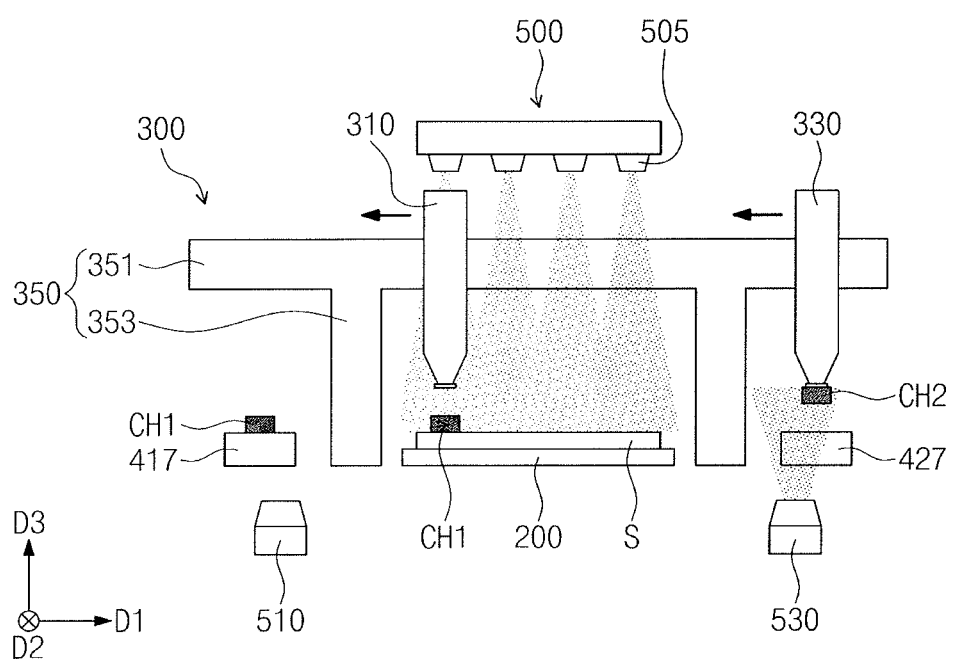
Figure 8E:
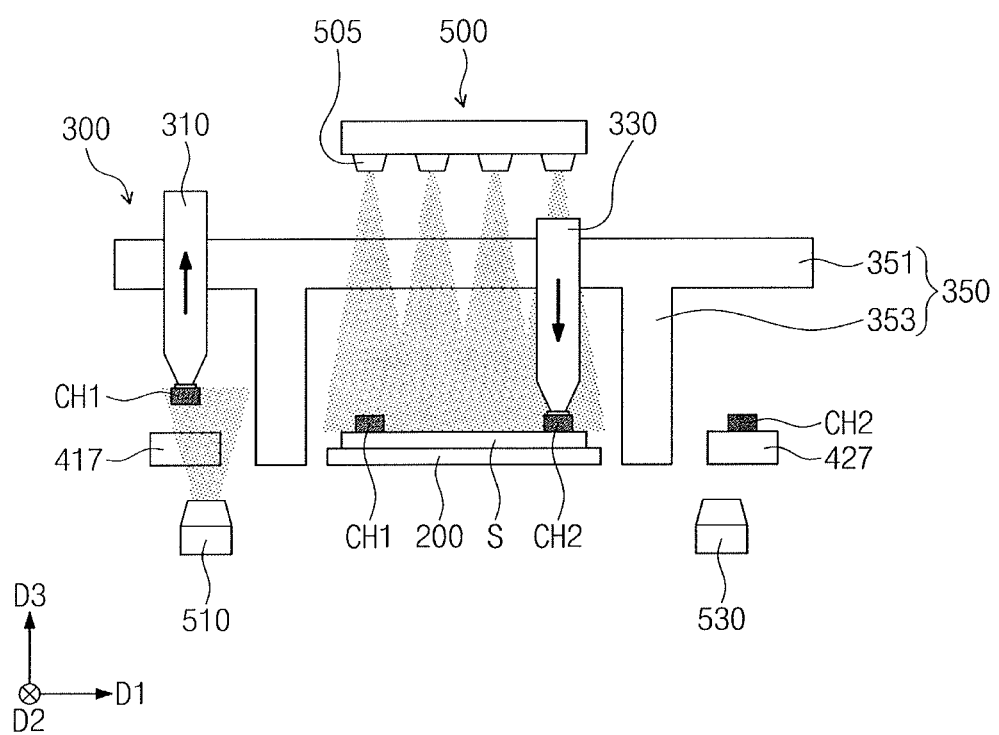

The first bonding head 310 may move in the first direction D1 after picking up the first chip CH1. In other words, the first bonding head 310 may move along the guide frame 351 toward the stage 200, e.g., from left to right in FIG. 8B. At this time, the second bonding head 330 may also move in the same direction as the first bonding head 310, e.g., also from left to right in FIG. 8B. In other words, the second bonding head 330 may move along the guide frame 351 in the first direction D1, e.g., to pick up the second chip CH2 (FIG. 8B). The first chip transfer part 417 may move to receive the first chip CH1 from the first chip picker 413, e.g., after the first bonding head 310 picks up the first chip CH1, the first chip transfer part 417 may move to receive another first chip CH1 from the first chip picker 413. For example, as illustrated in FIG. 8B, the first and second bonding heads 310 and 330 may move simultaneously along a same direction (along the arrow direction in FIG. 8B), e.g., to maintain a constant horizontal distance therebetween or to have only one of the first and second bonding heads 310 and 330 above the stage 200, while each of the first and second bonding heads 310 and 330 performs a different action at the end of the movement (either bonding or picking up a chip).

In some embodiments, when the first bonding head 310 moves toward the stage 200, the second image acquisition unit 510 may acquire an image of the picked-up first chip CH1 under the first bonding head 310, e.g., the second image acquisition unit 510 may be positioned under the first bonding head 310 to face the first bonding head 310 and to acquire an image of the picked-up first chip CH1 on the first bonding head 310 while moving over the stage 200. Alternatively, in certain embodiments, when the first bonding head 310 picks up the first chip CH1, the second image acquisition unit 510 may acquire an image of the picked-up first chip CH1 under the first bonding head 310, e.g., the second image acquisition unit 510 may be positioned under the first bonding head 310 to face the first bonding head 310 and to acquire an image of the picked-up first chip CH1 on the first bonding head 310 while moving toward the stage 200. The controller 600 may analyze the second image data I2 obtained by the second image acquisition unit 510 to determine whether the first chip CH1 is accurately picked up by the first bonding head 310 or not. This will be described later in detail with reference to FIG. 10.

Referring to FIGS. 1, 2, 3, and 8C, the first bonding head 310 may be located over the substrate S. In other words, the first bonding head 310 may move to be positioned to vertically overlap with the substrate S. The first bonding head 310 may descend downward to bond the first chip CH1 to one of the bonding areas BA of the substrate S. The first bonding head 310 may press the first chip CH1 with a force of about 100N to bond the first chip CH1 to the bonding area BA. When the first chip CH1 is bonded by pressure, the first bonding head 310 may heat the first chip CH1 to a temperature of about 300 degrees Celsius, e.g., bonding may be performed by wire bonding or flip-chip.

While the first bonding head 310 descends to bond the first chip CH1 to the substrate S, the second bonding head 330 descends toward the second chip transfer part 427. In other words, the second bonding head 330 may be positioned to vertically overlap with the second chip transfer part 427. The second bonding head 330 may pick up the second chip CH2 from the second chip transfer part 427.

Referring to FIGS. 1, 2, 3, and 8D, the second bonding head 330 may move along the guide frame 351 toward the stage 200 with the picked up second chip CH2. At this time, the first bonding head 310 may move along the guide frame 351 toward the first chip transfer part 417, e.g., both the first and second bonding heads 310 and 330 may move simultaneously along the arrow direction in FIG. 8D. In other words, the first and second bonding heads 310 and 330 may move in a direction opposite to the first direction D1. The second chip transfer part 427 may move to receive the second chip CH2 from the second chip picker 423, e.g., after the second bonding head 313 picks up the second chip CH2, the second chip transfer part 427 may move to receive another second chip CH2 from the second chip picker 423.

The first image acquisition unit 500 may acquire an image of the substrate S, to which the first chip CH1 is bonded, over the stage 200. The controller 600 may analyze the first image data I1 obtained by the first image acquisition unit 500 to determine whether the first chip CH1 is accurately bonded to the bonding area BA of the substrate S or not.

In some embodiments, when the second bonding head 330 moves toward the stage 200, the third image acquisition unit 530 may acquire an image of the picked-up second chip CH2 under the second bonding head 330. Alternatively, in certain embodiments, when the second bonding head 330 picks up the second chip CH2, the third image acquisition unit 530 may acquire an image of the picked-up second chip CH2 under the second bonding head 330. The controller 600 may analyze the third image data I3 obtained by the third image acquisition unit 530 to determine whether the second chip CH2 is accurately picked up at the second bonding head 330 or not.

Referring to FIGS. 1, 2, 3, and 8E, the second bonding head 330 may be located over the substrate S. In other words, the second bonding head 330 may be positioned to vertically overlap with the substrate S. In some embodiments, the second bonding head 330 may descend downward to bond the second chip CH2 to one of the bonding areas BA of the substrate S. The second bonding head 330 may press the second chip CH2 to bond the second chip CH2 to the bonding area BA. The second bonding head 330 may heat the second chip CH2 when the second chip CH2 is bonded by pressure. Alternatively, in certain embodiments, the second bonding head 330 may bond the second chip CH2 onto the first chip CH1 bonded to the substrate S.

When the second bonding head 330 bonds the second chip CH2 to the substrate S, the first bonding head 310 may be located over the first chip transfer part 417. In other words, the first bonding head 310 may be positioned to vertically overlap with the first chip transfer part 417. The first bonding head 310 may pick up the first chip CH1 on the first chip transfer part 417.

The first and second bonding heads 310 and 330 may repeat the processes described above. In other words, the chip bonding process may be repeatedly performed. The chip bonding process may require an accuracy of several micrometers or less. However, when the chip bonding process is repeatedly performed, a temperature of the bonding apparatus 10 may increase. The bonding accuracy of the chip bonding process may be deteriorated or reduced by a change in surrounding environment such as temperature. Thus, to maintain a high bonding accuracy, revision of the surrounding environment change may be performed on the bonding apparatus 10. A revision process of revising a fine change will be described hereinafter.

Figure 9:
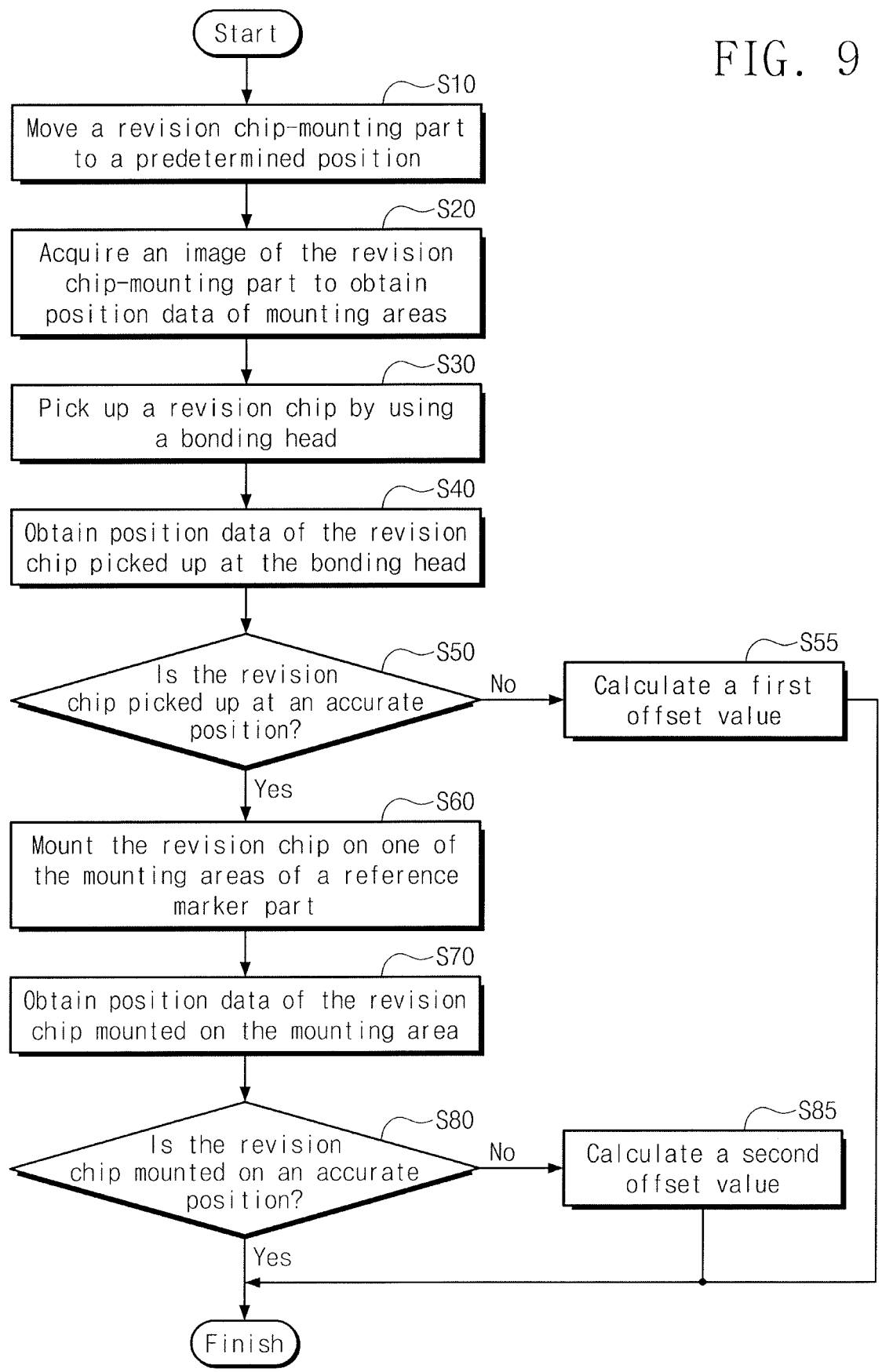
FIG. 9 illustrates a flow chart of a revision process of a chip bonding position of the bonding apparatus of FIG. 1.
Figure 10:
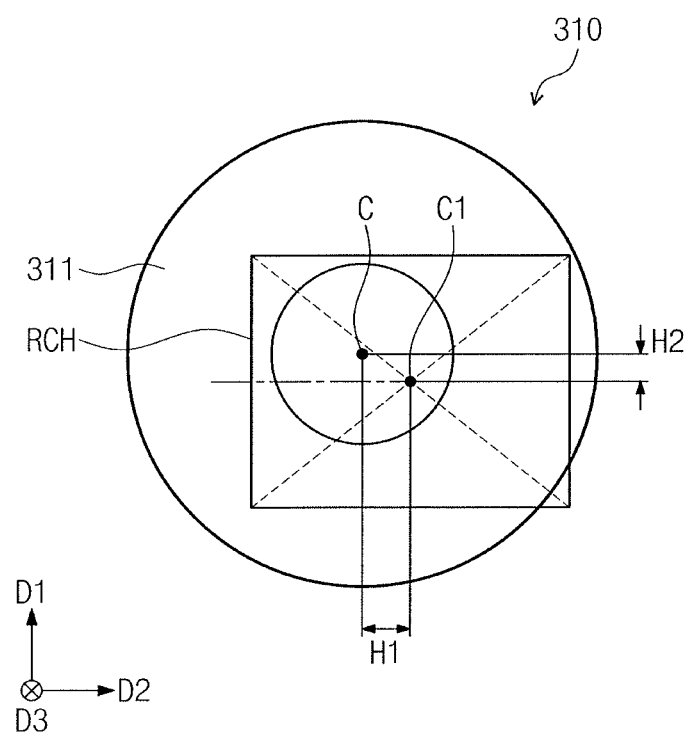
FIG. 10 illustrates a view of an image acquired in a second image acquisition unit of FIG. 1.
Figure 11:
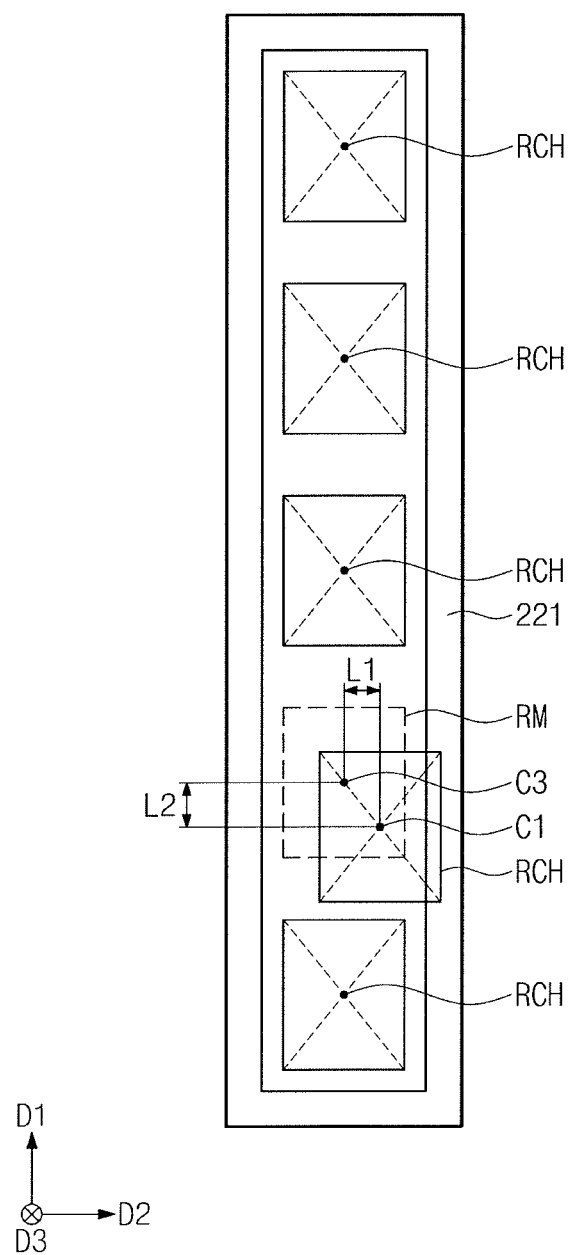
FIG. 11 illustrates a plan view of a revision chip located on a revision chip-mounting part of FIG. 1.

FIG. 9 is a flow chart illustrating a revision process of a chip bonding position of the bonding apparatus 10. FIG. 10 is a view illustrating an image acquired by the second image acquisition unit 510. FIG. 11 is a plan view illustrating a revision chip located on the revision chip-mounting part 220.

A revision process of a chip bonding position (hereinafter, referred to as a revision process) may be performed periodically. The revision process may be performed during and/or before the chip bonding process.

Referring to FIGS. 1, 2, 3, 9, 10, and 11, the revision process may include moving the revision chip-mounting part 220 to a predetermined position (S10). In detail, the controller 600 may control the stage transfer part 230 to move the revision chip-mounting part 220 to the predetermined position. The predetermined position may mean a position at which the revision chip-mounting part 220 is on the same line as the first and second bonding heads 310 and 330. In addition, the revision chip-mounting part 220 may vertically overlap with the opening 352 and the first image acquisition unit 500.

The revision process may include acquiring an image of the revision chip-mounting part 220 to obtain position data of the mounting areas (S20). For example, the first image acquisition unit 500 may acquire the image of the revision chip-mounting part 220 over the revision chip-mounting part 220 to obtain the first image data I1. The first image acquisition unit 500 may transmit the first image data I1 including the image of the revision chip-mounting part 220 to the controller 600. The first image data I1 may include the position data of the mounting areas RM of the reference marker part 221.

The revision process may include picking up the revision chip RCH by using at least one of the first and second bonding heads 310 and 330 (hereinafter, the first bonding head 310) (S30).

The revision process may include acquiring an image of the bonding head to obtain position data of the revision chip RCH picked up at the bonding head (S40). For example, the second image acquisition unit 510 may acquire the image of the first bonding head 310, picking up the revision chip RCH, under the first bonding head 310. Thus, the second image data I2 obtained by the second image acquisition unit 510 may include position data of the revision chip RCH picked up by the first bonding head 310.

The revision process may include determining whether the revision chip RCH is picked up at an accurate position or not (S50). The controller 600 may analyze the position data of the picked-up revision chip RCH to determine whether the revision chip RCH is accurately picked up by the first bonding head 310 or not. For example, when the first reference point C1 of the revision chip RCH corresponds to an imaginary central axis C of the first bonding head 310, the controller 600 may determine that the revision chip RCH is accurately picked up by the first bonding head 310. When the first reference point C1 does not correspond to the central axis C of the first bonding head 310, the controller 600 may determine that the revision chip RCH is not accurately picked up by the first bonding head 310. Here, the central axis C may be an imaginary line passing through a center of the first bonding head 310. The central axis C may be parallel to the third direction D3.

When the revision chip RCH is not accurately picked up by the first bonding head 310, the revision process may include calculating a first offset value (S55). As illustrated in FIG. 10, the first reference point C1 of the revision chip RCH picked up by the first bonding head 310 may not be located at the central axis C of the first bonding head 310. In this case, the controller 600 may calculate the first offset value by using the second image data I2. The first offset value may include a first spaced distance value H1 and a second spaced distance value H2 between the first reference point C1 and the central axis C. The first spaced distance value H1 means a spaced distance in the second direction D2 between the first reference point C1 and the central axis C. The second spaced distance value H2 means a spaced distance in the first direction D1 between the first reference point C1 and the central axis C. The controller 600 may reflect the first offset value to the bonding process.

The revision process may include mounting the revision chip RCH on the mounting area RM of the reference marker part 221 (S60). For example, the first bonding head 310 may mount the revision chip RCH on one of the mounting areas RM of the reference marker part 221.

The revision process may include obtaining position data of the revision chip RCH mounted on the mounting area RM (S70). For example, the first image acquisition unit 500 may acquire an image of the revision chip-mounting part 220. Thus, first image data I1 may include the position data of the mounted revision chip RCH.

The revision process may include determining whether the revision chip RCH is accurately mounted on the mounting area RM or not (S80). The controller 600 may analyze the position data of the mounted revision chip RCH to determine whether the revision chip RCH is accurately mounted on the mounting area RM or not. For example, when the first reference point C1 of the revision chip RCH corresponds to the second reference point C2 of the mounting area RM, the controller 600 may determine that the revision chip RCH is accurately mounted on the mounting area RM. When the first reference point C1 of the revision chip RCH does not correspond to the second reference point C2 of the mounting area RM, the controller 600 may determine that the revision chip RCH is not accurately mounted on the mounting area RM.

When the revision chip RCH is not accurately mounted on the mounting area RM, the revision process may include calculating a second offset value for revision (S85). As illustrated in FIG. 11, the first reference points C1 of first, third, fourth, and fifth revision chips RCH may correspond to the second reference points C2 of first, third, fourth, and fifth mounting areas RM, respectively. However, the first reference point C1 of a second revision chip RCH may not correspond to the second reference point C2 of a second mounting area RM. Thus, the controller 600 may calculate the second offset value by using the first image data I1. The second offset value may include a first spaced distance value L1 and a second spaced distance value L2 between the first reference point C1 and the second reference point C2. The first spaced distance value L1 means a spaced distance in the second direction D2 between the first and second reference points C1 and C2. The second spaced distance value L2 means a spaced distance in the first direction D1 between the first and second reference points C1 and C2.

The controller 600 may reflect the second offset value to the bonding process. The controller 600 may adjust movement distances of the first and/or second bonding heads 310 and 330 by using the first and/or second offset values. In addition, the controller 600 may adjust a movement distance of the stage 200 by using the first and/or second offset values. The controller 600 may transmit the first and/or second offset values to a display unit. The display unit may output or display the first and/or second offset values.

By way of summation and review, embodiments provide a bonding apparatus capable of efficiently performing a bonding process of a chip, thereby preventing or substantially minimizing bonding defects. That is, the bonding apparatus according to embodiments includes multiple bonding heads sequentially supplying and bonding chips to the substrate, i.e., while one bonding head is bonding a chip to the substrate the other bonding head is picking up chips, thereby increasing efficiency. Further, the chip position on the substrate may be inspected and corrected, as well as inspection for foreign matter, without time loss via an image acquisition unit, e.g., an array camera on a gantry combining a plurality of CCDs with a resolution suitable for the size of the substrate that combines the images of each of the CCDs so an entire surface of the substrate can be recognized by one shot.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A bonding apparatus, comprising:
    a stage supporting a substrate;
    a first bonding head at a first side of the stage, the first bonding head to pick up a first chip and to bond the picked-up first chip onto the substrate;
    a second bonding head at a second side of the stage, the second bonding head to pick up a second chip and to bond the picked-up second chip onto the substrate;
    a first image acquisition unit over a movement path of the stage to acquire an image of the stage;
    a first chip supply part to supply the first chip to the first bonding head;
    a second chip supply part to supply the second chip to the second bonding head; and
    a gantry including:
        a guide frame intersecting the movement path of the stage, the guide frame including two parallel rails at a higher level than the stage and with an opening therebetween, and the first image acquisition unit overlapping the opening, and
        at least one support frame supporting the guide frame, the first and second bonding heads being moveable on the guide frame,
    wherein the first chip supply part is at a side of the stage, and the second chip supply part is at another side of the stage, and
    wherein each of the first and second bonding heads includes:
        a bonding picker transfer part contacting both two parallel rails, the bonding picket transfer part being slidable in the opening along the two parallel rails, and
        a bonding picker penetrating through the bonding picker transfer part and extending perpendicularly to the two parallel rails.

2. The bonding apparatus as claimed in claim 1, wherein the first and second bonding heads are moveable in a same direction along the guide frame.

3. The bonding apparatus as claimed in claim 1, wherein the first image acquisition unit includes a plurality of imaging devices arranged in a direction intersecting the movement path of the stage.

4. The bonding apparatus as claimed in claim 1, wherein the first and second bonding heads face each other.

5. The bonding apparatus as claimed in claim 1, further comprising a controller to control the first and, second bonding heads, to obtain image data from the first image acquisition unit, and to detect a foreign material on the substrate based on the obtained image data.

6. The bonding apparatus as claimed in claim 5, wherein the controller controls one of the first and second bonding heads to pick up a chip while the other of the first and second bonding heads bonds, a chip onto the substrate.

7. The bonding apparatus as claimed in claim 1, wherein the stage includes a bonding stage to support the substrate, and a revision chip-mounting pan coupled to the bonding stage.

8. The bonding apparatus as claimed in claim 7, wherein the revision chip-mounting pan includes a plurality of mounting areas arranged in a direction intersecting the movement path of the stage.

9. The bonding apparatus as claimed in claim 1, further comprising:
    a second image acquisition unit under the first bonding head to acquire an image of the first bonding head; and
    a third image acquisition, unit under the second bonding head to acquire an image of the second bonding head.

10. A bonding apparatus, comprising:
    a base;
    a stage on the base to support a substrate, the stage being moveable on the base;
    a bonding unit at a movement path of the stage on the base; and
    a first image acquisition unit over the movement path, the first image acquisition unit including a plurality of imaging devices arranged in a direction intersecting the movement path,
    wherein the bonding unit includes:
        a guide frame located over the movement path and intersecting the movement path, the guide frame including two parallel rails at a higher level than the stage and with an opening therebetween, and the first image acquisition unit overlapping the opening,
        at least one support frame supporting the two parallel rails of the guide frame, and
        first and second bonding heads facing each other on the guide frame and moveable along the two parallel rails of the guide frame, each of the first and second bonding heads extending between the two parallel rails of the guide frame while contacting both of the two parallel rails of the guide frame,
    wherein each of the first and second bonding heads includes:
        a bonding picker transfer part contacting both two parallel rails of the guide frame, the bonding picker transfer part being slidable in the opening along the two parallel rails, and
        a bonding picker penetrating through the bonding picker transfer part and extending perpendicularly to the two parallel rails of the guide frame.

11. The bonding apparatus as claimed in claim 10, further comprising a controller to control, the first and second bonding heads, to obtain image data from the first image acquisition unit, and to detect a foreign material on the substrate based on the obtained image data.

12. The bonding apparatus as claimed in claim 11, wherein the controller controls one of the first and second bonding heads to pick up a chip while the other of the first and second bonding beads bonds a chip onto the substrate.

13. A bonding apparatus, comprising:

a stage supporting a substrate, the stage being moveable along a first direction;

a first bonding, head at a first side of the stage, the first bonding head to pick up a first chip and to bond the picked-up first chip onto the substrate;

a second bonding head at a second side of the stage, the second bonding head to pick up a second chip and to bond the picked-up second chip onto the substrate, and the first and second bonding heads having a constant horizontal distance therebetween while being moveable simultaneously along a second direction perpendicular to the first direction;

a first image acquisition unit over a movement path of the stage to acquire an image of the stage; and a gantry including:

a guide frame intersecting the movement path of the stage, the guide frame including two parallel rails at a higher level than the stage and with an opening therebetween, and the first image acquisition unit overlapping the opening, and at least one support frame supporting the guide frame, the first and second bonding heads being moveable on the guide frame, wherein each of the first and second bonding heads includes:

a bonding picker transfer part contacting both two parallel rails, the bonding picker transfer part being slidable in the opening along the two parallel rails, and a bonding picker penetrating through the bonding picker transfer part and extending perpendicularly to the two parallel rails.

14. The bonding apparatus as claimed in claim 13, wherein the first and second bonding beads are moveable to have only one of the first and second bonding beads above the stage.

15. The bonding apparatus as claimed in claim 13, wherein the first image acquisition unit is an array camera including a plurality of charge-coupled devices, the plurality of charge-coupled devices being, arranged along the second direction.

* * * * *